(12) United States Patent
Lee et al.

(10) Patent No.: US 6,424,263 B1
(45) Date of Patent: Jul. 23, 2002

(54) RADIO FREQUENCY IDENTIFICATION TAG ON A SINGLE LAYER SUBSTRATE

(75) Inventors: Youbok Lee, Chandler; Lee Furey, Phoenix; Roger St. Amand, Tempe, all of AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 09/728,217

(22) Filed: Dec. 1, 2000

(51) Int. Cl.$^7$ ............................................... G08B 13/14
(52) U.S. Cl. ................................................. 340/572.7
(58) Field of Search ......................... 340/572.7, 572.8, 340/572.5, 551, 10.34; 343/872, 873

(56) References Cited

U.S. PATENT DOCUMENTS

| | | | | |
|---|---|---|---|---|
| 4,857,893 A | * | 8/1989 | Carroll ........................ | 340/572 |
| 5,276,431 A | * | 1/1994 | Piccoli et al. ................ | 340/572 |
| 5,574,470 A | * | 11/1996 | De Vall ........................ | 340/572 |
| 5,682,143 A | * | 10/1997 | Brady et al. ................. | 340/572 |
| 5,926,094 A | * | 7/1999 | Mamou .................... | 340/572.3 |
| 6,091,332 A | * | 7/2000 | Eberhardt et al. ........ | 340/572.1 |
| 6,100,804 A | * | 8/2000 | Brady et al. .............. | 340/572.7 |
| 6,198,381 B1 | * | 3/2001 | Turner et al. ............ | 340/572.1 |

* cited by examiner

Primary Examiner—John Tweel
(74) Attorney, Agent, or Firm—Baker Botts L.L.P.

(57) ABSTRACT

A radio frequency identification (RFID) tag on a single layer substrate comprises a semiconductor integrated circuit RFID tag device and antenna circuit. A connection jumper may be used to bridge over the antenna circuit coil turns. The RFID tag device is located on the same side as an inductor coil and capacitor which forms a parallel resonant antenna circuit. The inductor coil has an inner end and an outer end. The inner or outer end may be connected directly to the RFID tag device and the outer or inner end be may connected to the RFID tag device with a jumper over the inductor coil turns, or the RFID tag device may bridge the inductor coil turns when being connected to both the inner and outer ends. An encapsulation (glop top) may be used to seal the RFID tag device and jumper, and an insulated coating may be used to cover the entire surface of the substrate to create an inexpensive "chip-on-tag." The encapsulation may be epoxy, plastic or any protective material known to one of ordinary skill in the art of electronic circuit encapsulation. The insulated coating may be of any type suitable for the application of use of the RFID tag.

25 Claims, 10 Drawing Sheets

RADIO FREQUENCY IDENTIFICATION TAG ON A SINGLE LAYER SUBSTRATE

RELATED PATENT APPLICATION

This application is related to commonly owned U.S. patent application Ser. No. 09/728,190, filed Dec. 1, 2000, entitled "INDUCTIVELY TUNABLE ANTENNA FOR A RADIO FREQUENCY IDENTIFICATION TAG" by Youbok Lee, Lee Furey and Roger St. Amand, and is hereby incorporated by reference for all purposes.

BACKGROUND OF THE INVENTION

This invention relates generally to a radio frequency identification (RFID) tag, and more particularly, to a RFID tag on a single layer substrate comprising a semiconductor integrated circuit RFID tag device and antenna circuit.

DESCRIPTION OF THE RELATED TECHNOLOGY

A radio frequency identification (RFID) tag is a device that stores identification information and sends back this identification information, and may also include other information, when the device is powered-up by a radio frequency (RF) signal. RFID tags utilize radio frequencies that have much better penetration characteristics to material than do optical signals, and will work under more hostile environmental conditions than bar code labels. Therefore, the RFID tags may be read through paint, water, dirt, dust, human bodies, concrete, or through the tagged item itself. RFID tags are used in conjunction with a radio frequency tag reader (interrogator) which transmits RF signals and receives data signals from the RFID tag. These RFID tags may be used in managing inventory, automatic identification of cars on toll roads, security systems, electronic access cards, keyless entry and the like. More applications are becoming commercially feasible as the cost of the RFID tags decrease.

The passive RFID tag has no internal power source, rather it uses the incoming RF signal as a power source. Once the RFID tag is activated, it sends stored information to the interrogator. The RFID tag transmits this stored information to the reader-interrogator by modulating the amplitude of the RF carrier signal from the reader by detuning a resonant circuit of the RFID tag that is initially tuned to the RF carrier signal (de-Qing or loading, for example by resistive loading, of the resonant circuit in the RFID tag may also be used to modulate the amplitude of the RF carrier signal of the reader-interrogator). The resonant circuit of the RFID tag may be, for example, a parallel connected inductor and capacitor which is used as an antenna and is resonant (tuned) to the frequency of the RF carrier signal of the interrogator. A semiconductor integrated circuit is connected to the parallel resonant antenna circuit and comprises an RF to direct current (DC) converter, a modulation circuit to send the stored information to the reader-interrogator, a logic circuit which stores coded information, a memory array that stores digitized information, and controller logic that controls the overall functionality of the RFID tag.

The inductor of the parallel resonant antenna circuit generally may be formed into a coil using wire or printed circuit conductors positioned on one surface of a planar dielectric (electrically insulated) substrate with connections being made between this coil and the RFID tag device semiconductor integrated circuit. These connections generally require the use of both sides of the planar substrate and increase the cost and complexity in manufacturing the RFID tag and decreases reliability thereof. Therefore, what is needed is a more reliable, simpler, lower cost, and easier to manufacture RFID tag.

SUMMARY OF THE INVENTION

The invention overcomes the above-identified problems as well as other shortcomings and deficiencies of existing technologies by providing an RFID tag comprising a semiconductor integrated circuit (RFID tag device) connected to an inductor coil of a parallel resonant circuit antenna and a jumper to one end of the parallel resonant circuit antenna, all being on one side of a dielectric substrate. The inductor coil may resonate with a discrete capacitor connected to the inductor coil, or a capacitor that is part of and internal to the semiconductor integrated circuit RFID tag device. A series resonant circuit antenna is also contemplated and within the scope of the invention.

In an embodiment of the invention, a RFID tag comprises a dielectric (electrically non-conductive and transparent to radio frequency signals) substrate having an antenna formed as an inductor by using electrically conductive material on only one side of the substrate. The substrate may be, for example but not limited to; PET, mylar, paper, plastic, kapton, ceramic, silicon, polyimide, polyvinylchloride (PVC), etc., and combinations thereof. A RFID tag device semiconductor integrated circuit die is attached to the substrate on the same side as the antenna inductor and is electrically connected thereto. The antenna inductor may be a spiral coil having two ends, an inner and an outer end. The inner end is connected to an inside spiral turn of the spiral coil and the outer end is connected to an outside spiral turn of the spiral coil. Generally, the semiconductor integrated circuit die is located on the inside of the spiral coil and is easily connected to the inner end of the spiral coil, since the inner end and the die may be in close proximity.

Connection to the RFID tag device semiconductor integrated circuit die may be by wire bonding, flipchip (C4), etc., or any combination thereof. The dielectric substrate may also have other connection pads that may be used for testing and/or programming the RFID tag. The semiconductor integrated die may be attached directly to the surface of the substrate, and the coil (and the other connection pads) may be formed on the same surface by printing, etching, hot stamping and the like. This type of coil construction allows better conductance (inverse of resistance) which results in a higher Q of the coil. The coil material is electrically conductive and may be, for example but not limited to; metal such as copper, aluminum, gold, plated metal, electrically conductive organic and inorganic materials, etc.

The outer end of the spiral coil is connected to the RFID tag device integrated circuit die with a jumper that is also on the same side of the substrate as the antenna coil and integrated circuit die. The jumper goes over the spiral coil from the outer end to a bond pad of the integrated circuit die in the case of wire bonding where the back of the die is attached to the surface of the substrate and the connection pads of the integrated circuit die are facing away from the surface of the substrate.

The jumper may be a bond wire connected by thermal compression bonding, ball bonding and the like. The jumper may also be any type of conductor that is cut, etched, deposited and the like which can be insulated from the inductor coil when passing thereover.

When using wire bonding, all connections to the integrated circuit die are made by bond wires, i.e., inner and outer ends of the coil, programming and test pads, etc. After the bond wires are installed, an encapsulation (glop top) cover may be used to protect the integrated circuit die and bond wires. This form of construction is easy to manufacture and low in cost. Intermediate pads may be used between the coil turns to reduce the length of the bond wire going from the outer end of the coil to the bond pad of the integrated circuit die. The inductor coil may be coated with a insulating coating so as to make the RFID tag completely insulated. Thus, a low cost "chip-on-tag" is created with no further processing required.

The semiconductor integrated circuit die may also be attached to connection pads on the substrate by using flipchip or C4 connections wherein "solder ball bumps" on bond pads of the die attach to the substrate pads and all other connections to these pads are by printed circuit conductors and a bond wire (jumper across coil turns). A thin insulating layer such as polyimide may be used between the coil jumper and the inductor coil turns to prevent shorting of the coil, however, once the encapsulation (glop top) is in place and has cured, no movement of the jumper bond wire can occur.

In another embodiment of the invention, a flipchip die straddles the inductor coil turns so that one solder ball bump of the flipchip die connects to the outer end of the inductor coil and another solder ball bump of the flipchip die connects to the inner end of the inductor coil. A conductive trace may also be provided within the flipchip die that is a conductive circuit within the die that may serve as a jumper over the turns of the inductor coil. The conductive trace may be adapted to connect an external capacitor in parallel with the inductor coil. The external capacitor may be located inside or outside of the inductor coil turns and may be on the same side of the substrate as the inductor coil and die.

In still another embodiment, a die may be attached over a portion of the inductor coil turns with an insulating layer of material therebetween. The insulating layer may be a B-staged kapton or epoxy that may be cured so as to attach the die to the substrate. Mylar, mica, plastic, teflon, kapton, polyimide and the like may be used as an insulating layer that is attached to the substrate and the die. The die has bond pads thereon and wire bonding (bond wires) may be used to connect the die bond pads to the inner and outer ends of the inductor coil turns. The bond wires may be used as jumpers over the inductor coil turns and further may allow the inductor coil turns to remain at full width while passing under the die. By allowing the inductor coil turns to remain at full width, the coil turns have a lower resistance and thus yield a higher quality factor (higher Q). A conductive trace may also be provided within the die that is a conductive circuit through the die that may be adapted to connect an external capacitor in parallel with the inductor coil. The external capacitor may be located inside or outside of the inductor coil turns and may be on the same side of the substrate as the inductor coil and die.

Features and advantages of the invention will be apparent from the following description of presently preferred embodiments, given for the purpose of disclosure and taken in conjunction with the accompanying drawings.

DETAILED DESCRIPTION OF THE PREFERRED EMBODIMENTS

Figure 1:
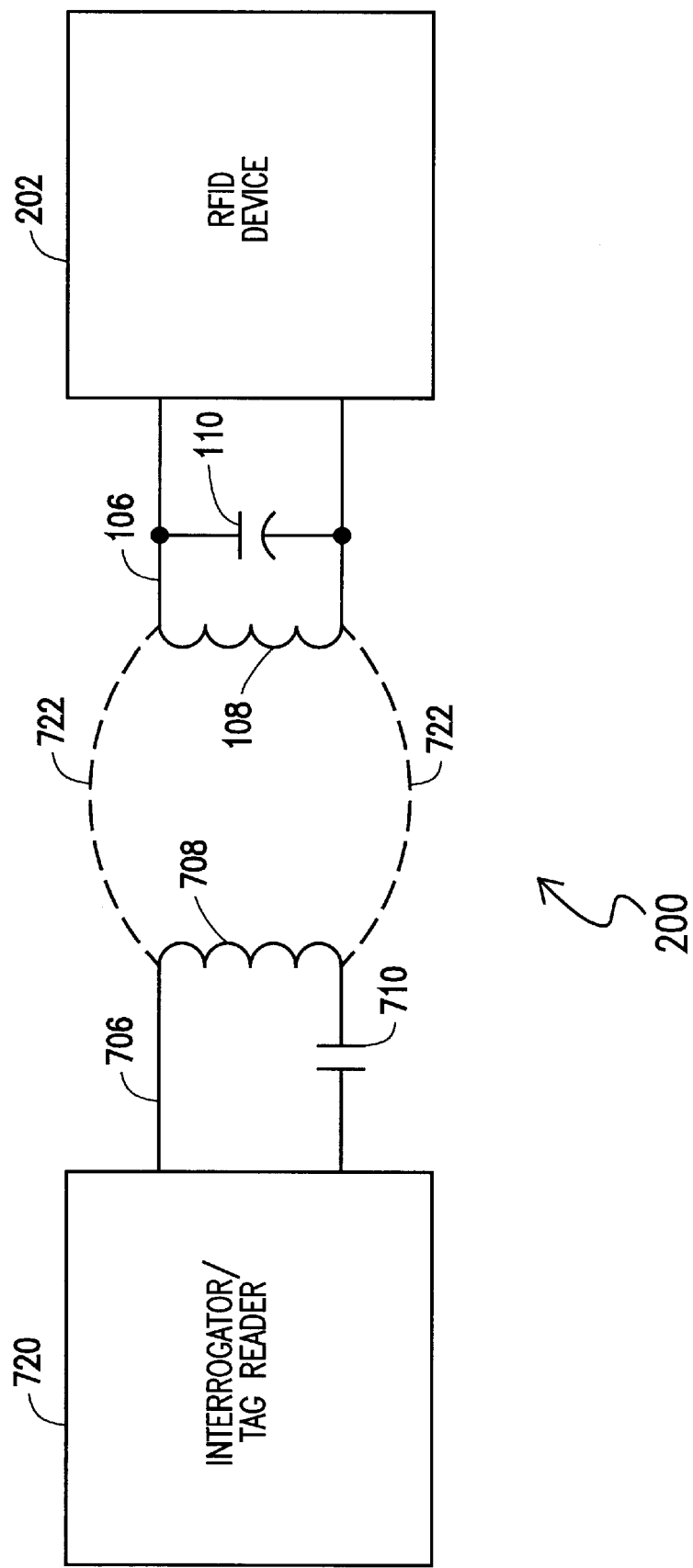
FIG. 1 illustrates a schematic block diagram of an RFID tag system that includes both a radio frequency reader (Interrogator) and a RFID tag.

The present invention is directed to a radio frequency identification (RFID) tag comprising a RFID tag device semiconductor integrated circuit, and a parallel resonant antenna circuit comprising a coil inductor and a capacitor all being on the same side of a dielectric substrate of the RFID tag. The RFID tag device may be connected to one end of the parallel resonant antenna circuit with a jumper located on the same side as the coil inductor, capacitor and RFID tag device on the substrate. In addition, the RFID tag device may bridge over the coil inductor and directly attach to each end of the coil inductor or connect to each end of the coil inductor with bond wires on the same side of the substrate thereon.

Referring now to the drawings, the details of preferred embodiments of the invention are schematically illustrated. Like elements in the drawings will be represented by like numbers, and similar elements will be represented by like numbers with a different lower case letter suffix.

FIG. 1 illustrates a schematic block diagram of a RFID system that includes a radio frequency generator/interrogator/tag reader 720 and an RFID tag 200. The tag reader 720 has a tuned circuit 706 comprising an inductor 708 and a capacitor 710 connected in series. RF generator/interrogator/tag reader 720 produces continuous wave (CW) radio frequency (RF) power across the turned circuit 706. This CW RF power is electro-magnetically coupled by alternating current action to a parallel resonant circuit antenna 106 of the RFID tag 200. The CW RF electromagnetic power is generally represented by the numeral 722. The RFID tag 200 has a power converter circuit that converts some of the CW RF electromagnetic power 722 into direct current power for use by the logic circuits of the RFID tag integrated circuit device 202 (not illustrated).

When the parallel resonant circuit antenna 106 of the RFID tag 200 is in proximity to the tuned circuit 706 of the RF generator/interrogator/tag reader 720, it develops an AC voltage across the tuned circuit 106. The AC voltage across the parallel resonant circuit antenna 106 is rectified and when the rectified voltage becomes sufficient enough to activate the RFID tag integrated circuit device 202, the RFID tag 200 is activated and starts sending stored data in its memory register by modulating the incoming RF carrier signal 722 of the reader 720. The interrogator/tag reader 720 detects these modulated signals and converts them into a detected serial data word bitstream of on/off pulses representative of the information from the RFID tag 200.

Figure 2:
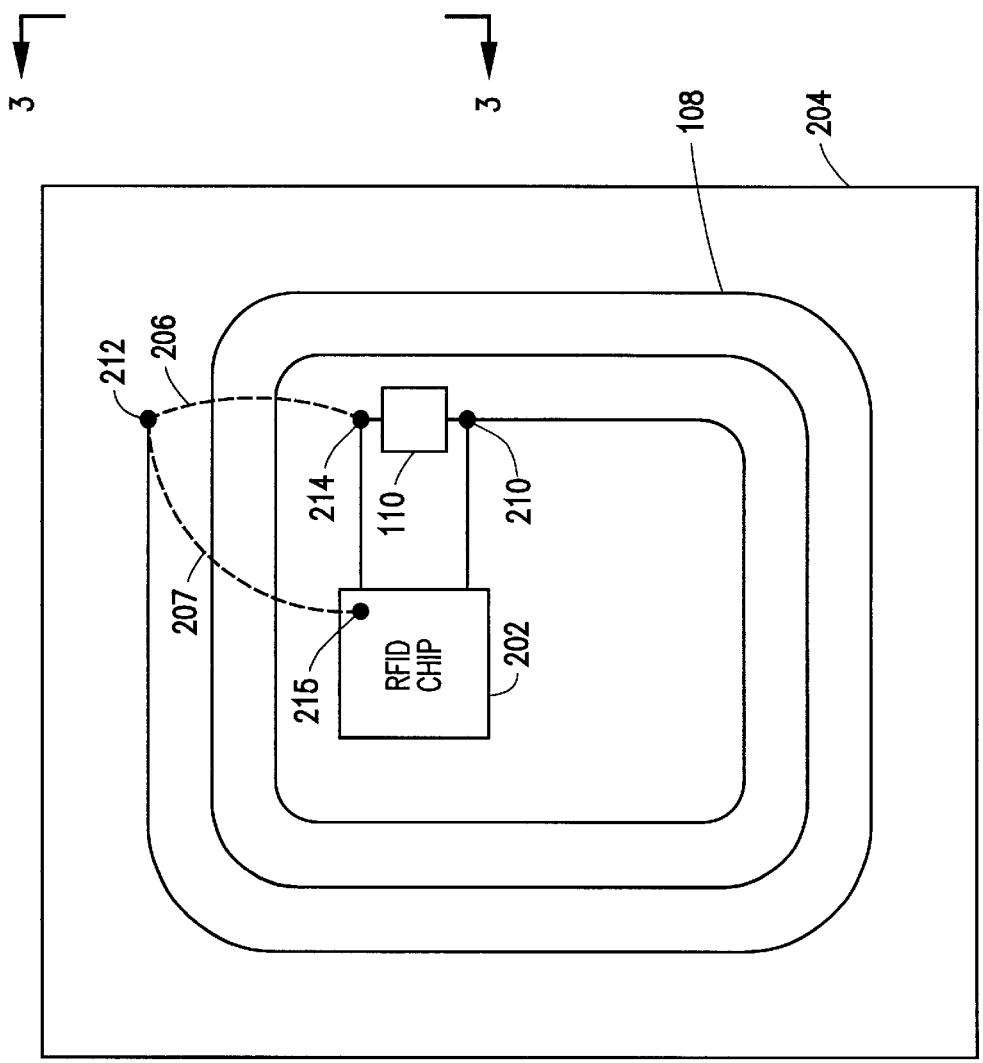
FIG. 2 illustrates a schematic plan view of an RFID tag according to an embodiment of the invention.

FIG. 2 illustrates a schematic plan view of an RFID tag 200 according to an embodiment of the invention. The parallel resonant circuit antenna 106 of the RFID tag 200 comprises an inductor coil 108 and a capacitor 110. The RFID device 202 is a semi-conductor integrated circuit device that includes electronic logic circuits for radio frequency identification purposes. A jumper 206 connects an outer end of the coil 108 to the capacitor 110 and RFID device 202. The coil 108, capacitor 110, RFID device 202 and jumper 206 are all on the same surface of an insulated substrate 204. This allows single sided substrates which are lower in cost and result in easier to manufacture RFID tags. The discrete capacitor 110 may be replaced with a capacitor which is integral with the RFID tag device 202.

The substrate 204 has a parallel resonant circuit antenna 106 formed by the inductor coil 108 and the capacitor 110. The substrate may be, for example but not limited to; PET, mylar, paper, plastic, kapton, polyimide, etc., and combinations thereof. The RFID tag device 202 is attached to the substrate 204 on the same side as the antenna inductor coil 108 and capacitor 110 and is electrically connected thereto. The antenna inductor coil 108 is a spiral coil having two ends, an inner end 210 and an outer end 212. Generally, the RFID tag device 202 is located on the inside of the coil 108 and is easily connected to the inner end 210, since the inner end 210 and the RFID tag device 202 are in close proximity. A connection pad 214 may be used to connect one end of the jumper 206. A jumper 207 may also be connected to a bond pad 215 on the RFID tag device 202. It is contemplated and within the scope of the invention that the inductor coil 108 and capacitor 110 also may be connected as a series resonant circuit antenna.

Connection to the RFID tag device 202 may be by wire bonding, flipchip (C4), etc., or any combination thereof. The dielectric substrate 204 may also have other connection pads that may be used for testing and/or programming the RFID tag 200 (see FIG. 6). The RFID tag device 202 may be attached directly to the surface of the substrate 204, and the coil 108 (and the other connection pads) may be formed on the same surface of the substrate 204 by printing, etching, hot stamping and the like. This type of coil construction allows better conductance (inverse of resistance) which results in a higher Q of the coil 108. The coil 108 is made of material that is electrically conductive and may be, for example but not limited to; metal such as copper and aluminum, plated metal, electrically conductive organic and inorganic materials, etc.

Figure 3:
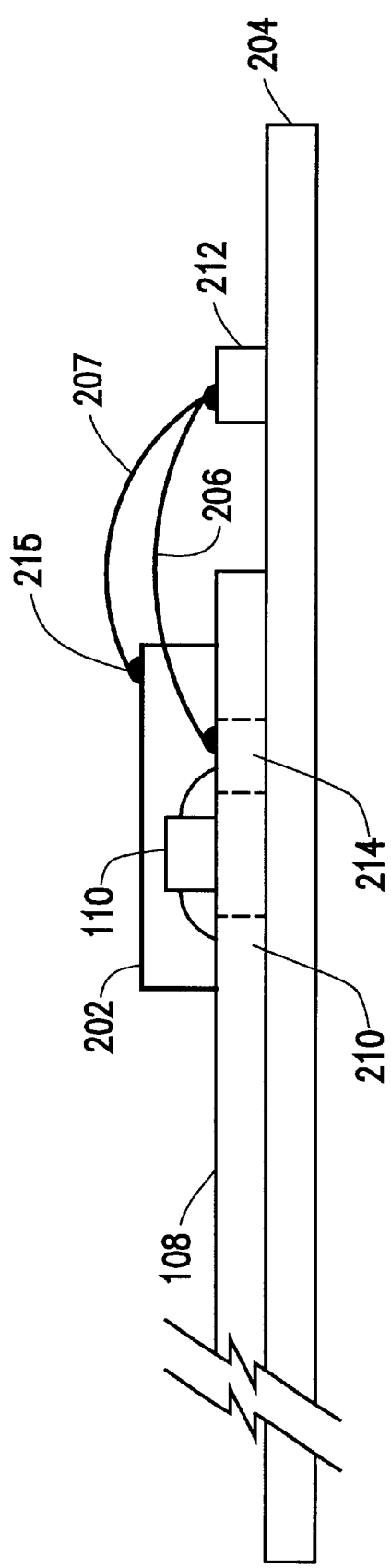
FIG. 3 is a schematic elevational view of a section of the embodiment illustrated in FIG. 2.

Referring to FIG. 3, an elevational view of a section 3—3 of the embodiment in FIG. 2 is illustrated. The jumper 207 is connected to the outer end 212 of the spiral coil 108 and may be connected directly to the bond pad 215 on the RFID tag device 202 or jumper 206 may be connected to the connection pad 214 and the outer end 212. All connections and components are on the same side of the substrate 204 as the antenna coil 108. The connection pad 214 is also connected to the capacitor 110 and the RFID tag device 202. The jumper 207 goes over the spiral coil 108 from the outer end 212 and may connect to the bond pad 215 of the RFID tag device 202 in the case of wire bonding where the back of the device 202 is attached to the surface of the substrate 204 and the bond pads of the RFID tag device 202 are facing away from the surface of the substrate 204.

Figure 4:
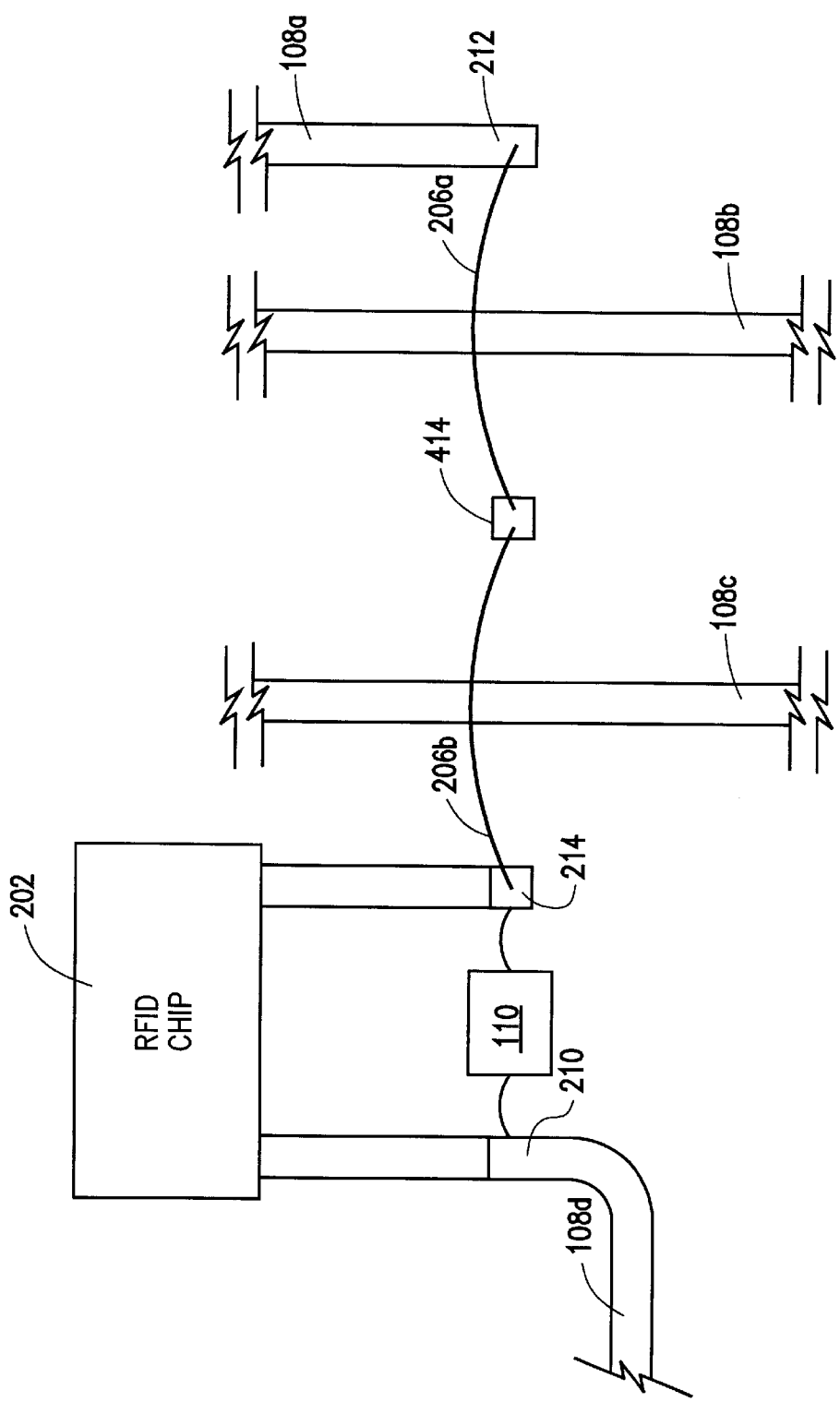
FIG. 4 is a schematic plan view of an alternate embodiment of the jumper connection of FIG. 2.

Referring to FIG. 4, a schematic plan view of an alternate embodiment of the jumper connection is illustrated. Intermediate connection pad(s) 414 may be used between the coil turns 108 to reduce the length of the bond wire 206 (now bond wires 206a and 206b) going from the outer end 212 to the connection pad 214. The connection pad 214 also is adapted to connect to the RFID tag device 202 and the capacitor 110.

Figure 5:
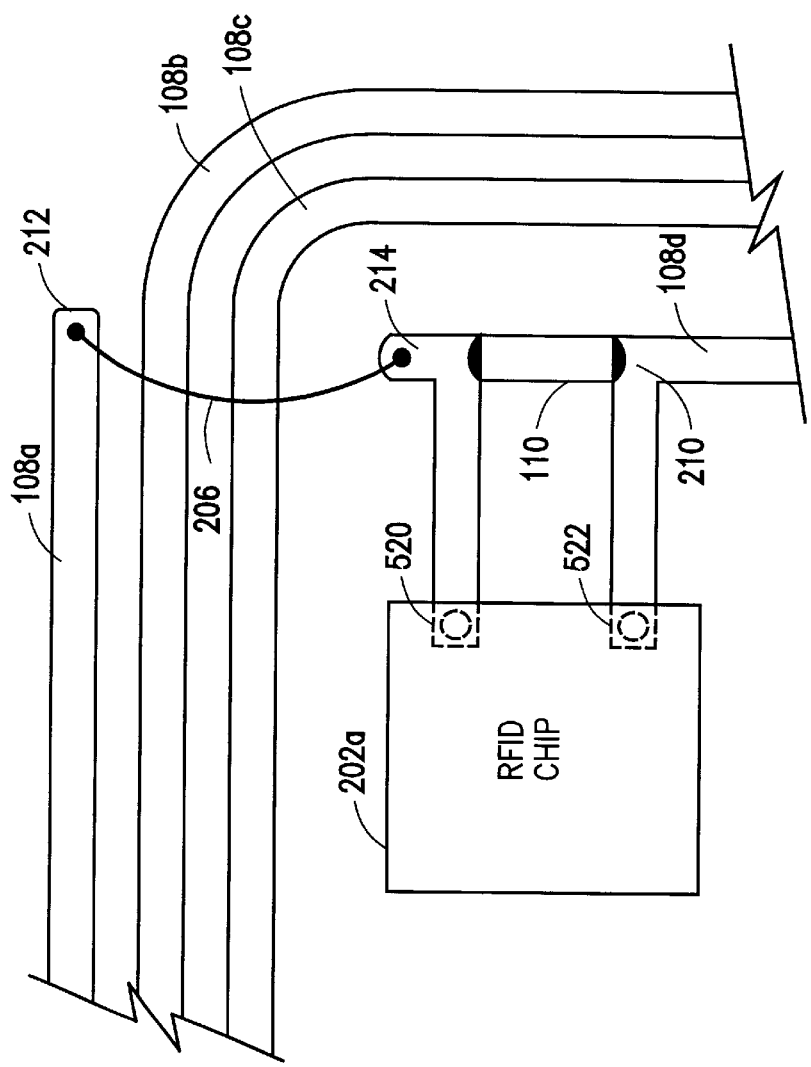
FIG. 5 is a schematic plan view of an embodiment of the invention having flipchip or C4 connections.

Referring to FIG. 5, a schematic plan view of an embodiment of the invention having flipchip or C4 connections is illustrated. The RFID tag device 202a is a flipchip or C4 device that is attached to connection pads 520 and 522 which are connected to connection pad 214 and inner coil end 210, respectively. The capacitor 110 is connected between the connection pad 214 and the inner coil end 210 and the jumper 206 connects the outer end 212 to the connection pad 214.

Figure 6:
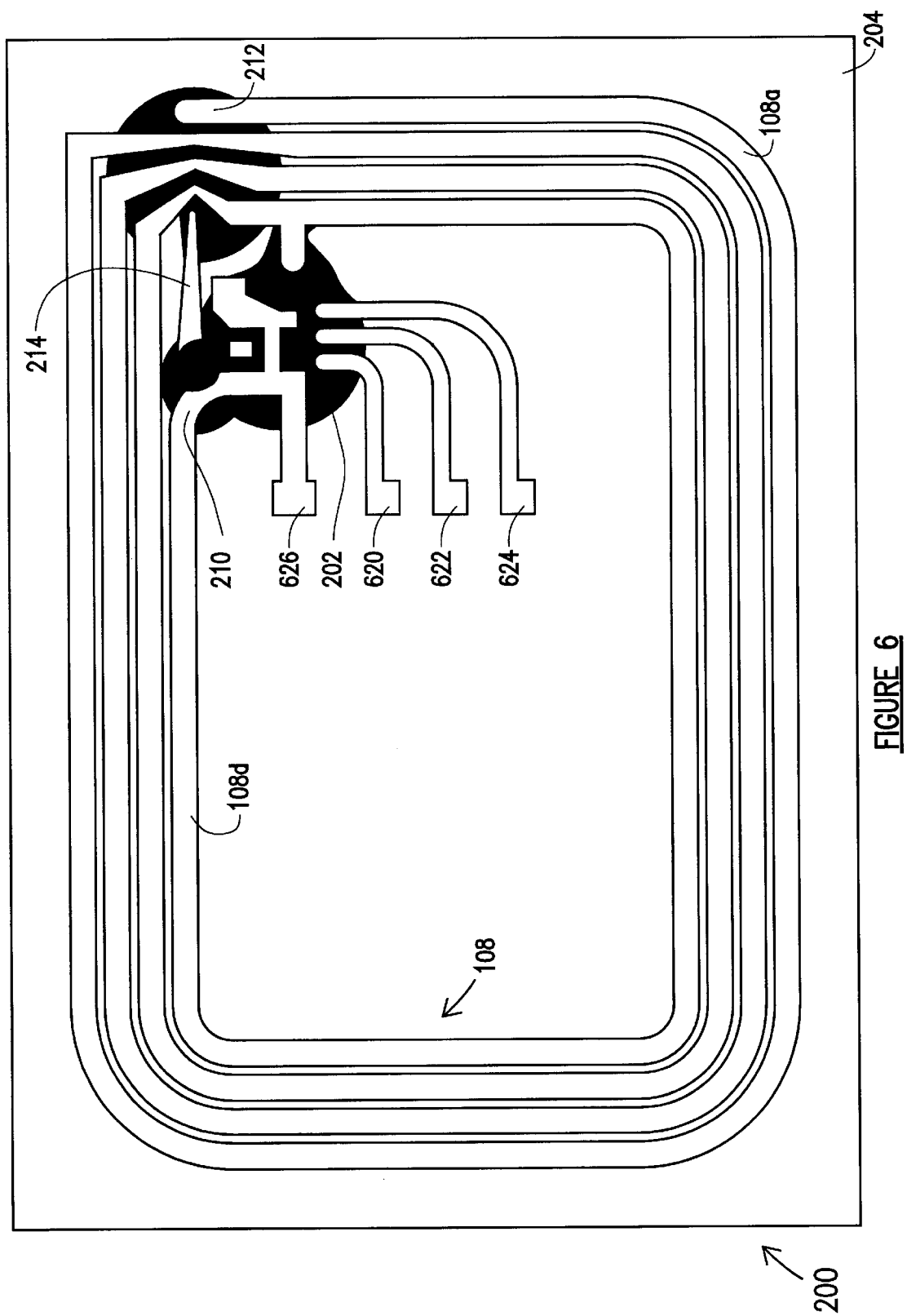
FIG. 6 is a schematic plan view of the underside of an embodiment of an RFID tag.

Referring to FIG. 6, a plan view of the underside (substrate is clear for illustrative purposes) of an embodiment of an RFID tag is illustrated. The coil 108 is on top of the substrate 204. Test pads 620, 622, 624 and 626 are illustrated connected to the RFID tag device 202. These test pads may be used during testing and programming of the RFID tag 200.

Figure 7:
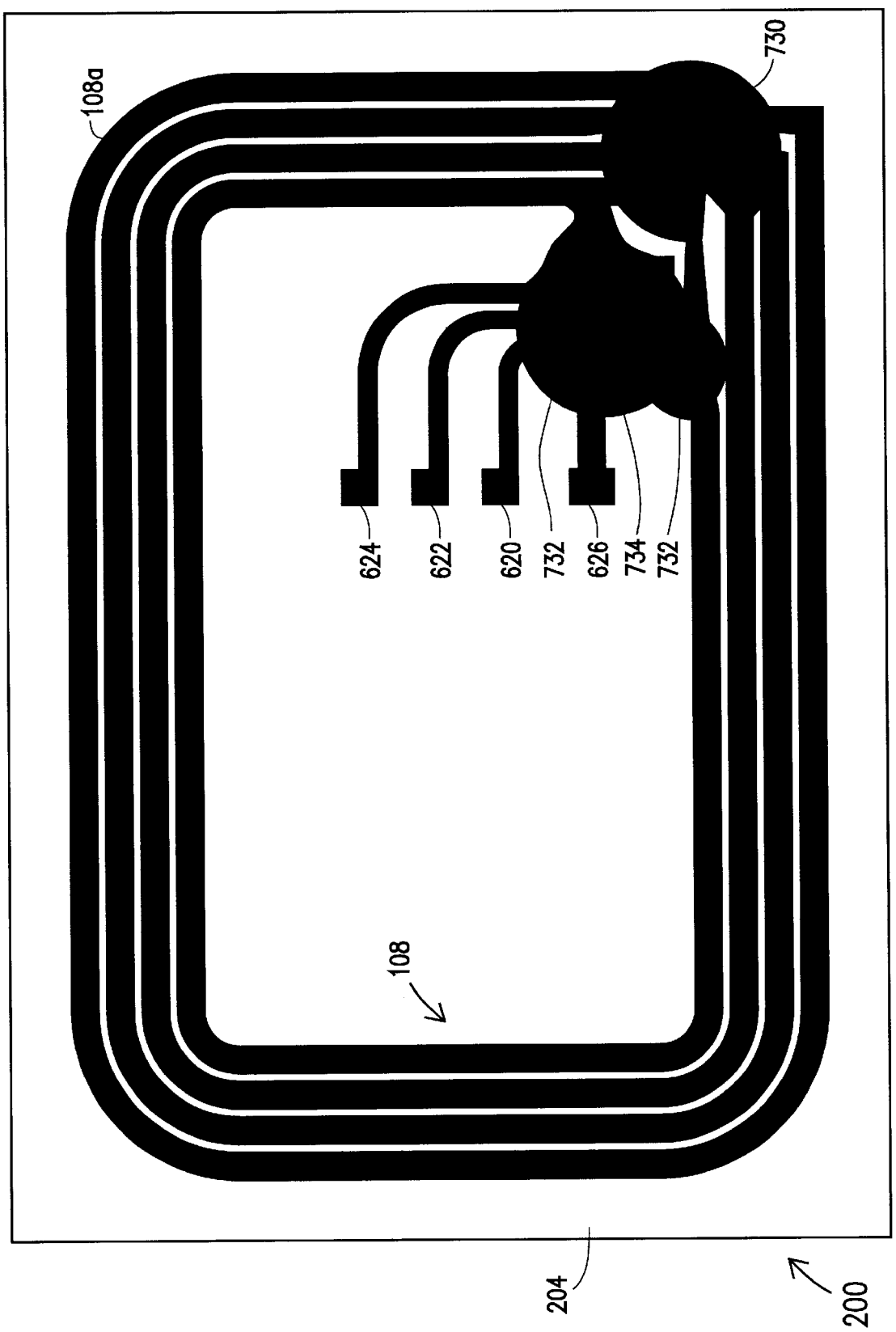
FIG. 7 is a schematic plan view of the top of the embodiment of FIG. 6.

Referring to FIG. 7, a plan view of the top of the embodiment of FIG. 6 is illustrated. A thin insulating layer (not illustrated) such as polyimide may be used between the coil jumper 206 and the inductor coil 108 to prevent shorting of the coil 108, however, once a glop top 730 is in place and has cured, no movement of the jumper bond wire 206 can occur. In addition the capacitor 110 may be covered with a glop top 732 and the RFID tag device 202 may be protectively covered with a glop top 734. The inductor coil 108 may be coated with a insulating coating so as to make the RFID tag 200 completely insulated. Thus, a low cost "chip-on-tag" is created with no further processing required. This form of construction is easy to manufacture and low in cost.

Figure 9:
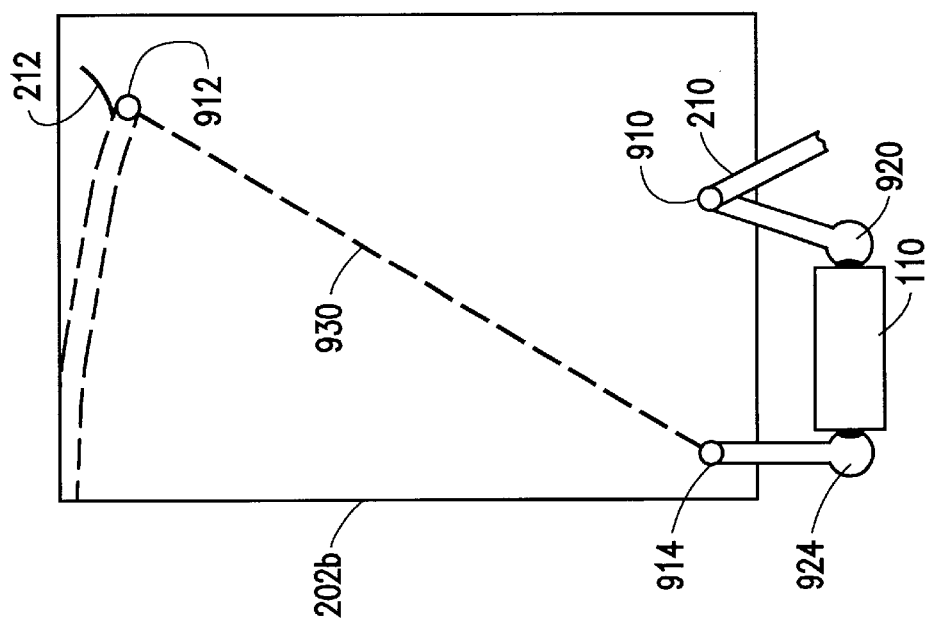
FIG. 9 is a schematic plan view of a portion of the RFID tag illustrated in FIG. 8.
Figure 8:
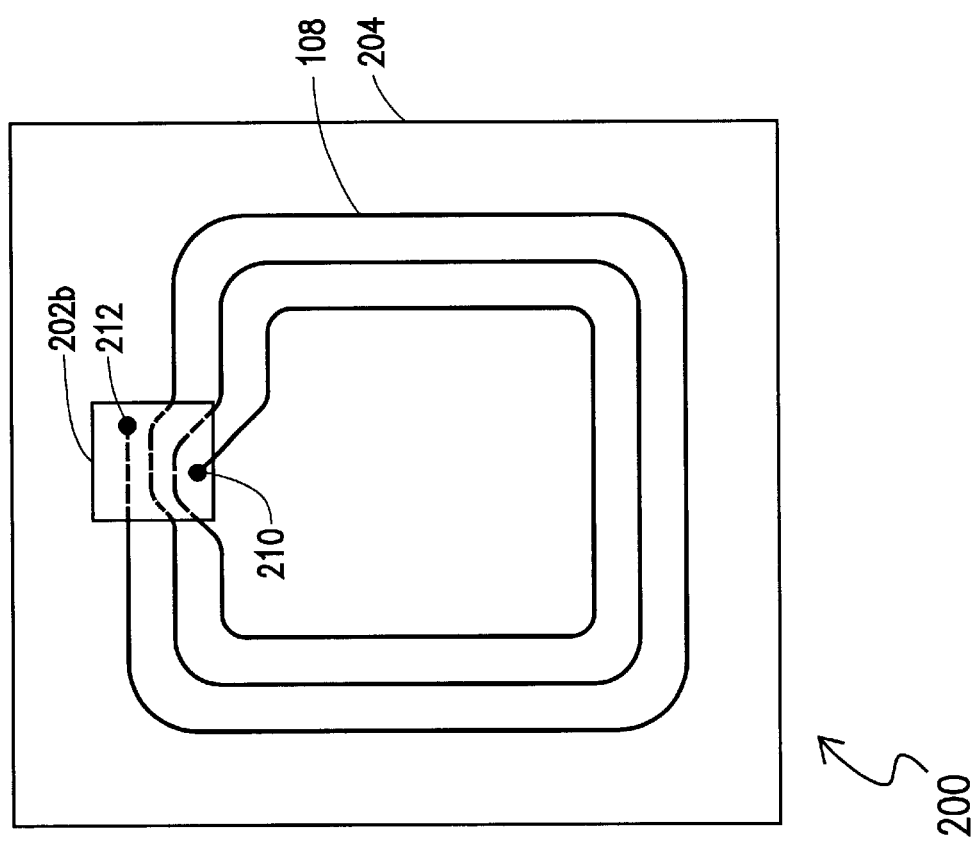
FIG. 8 is a schematic plan view of a flipchip embodiment of an RFID tag.

Referring to FIG. 8, a schematic plan view of a flipchip embodiment of an RFID tag 200 is illustrated. A flipchip die 202b straddles an inductor coil 108 so that one solder ball bump of the flipchip die 202b connects to an outer end 212 of the inductor coil 108 and another solder ball bump of the flipchip die 202b connects to the inner end 210 of the inductor coil 108. This embodiment requires no external jumper for connection to both the inner end 210 and the outer end 212 of the inductor coil 108. Referring to FIG. 9, a conductive trace 930 may also be provided within the flipchip die 202b that is a conductive connection within the die 202b that may serve as a jumper over the turns of the inductor coil. The conductive trace 930 may be adapted to connect an external capacitor 110 in parallel with the inductor coil 108. The external capacitor 110 may be located inside or outside of the inductor coil 108 and is preferably on the same side of the substrate 204 as the inductor coil 108 and flipchip die 202b. The external capacitor 110 may be a surface mount device attached to solder pads 924 and 920. The flipchip 202b has solder ball bumps 910, 912 and 914 which attach to corresponding solder pads on the substrate 204.

Figures 10, 11:
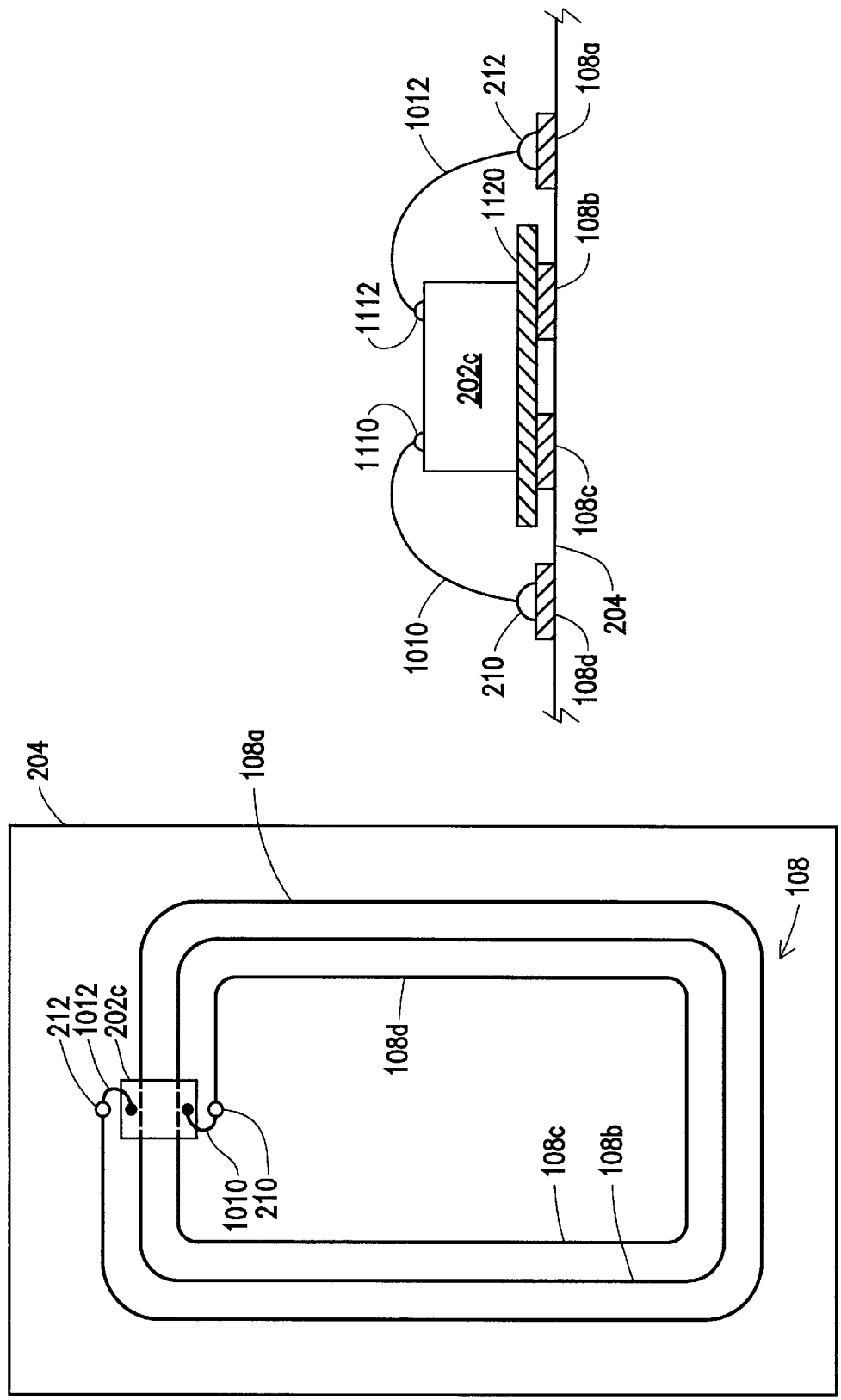
FIG. 10 is a schematic plan view of a bond wire embodiment of an RFID tag.
FIG. 11 is a schematic elevational view of a portion of the RFID tag illustrated in FIG. 10.
Figure 12:
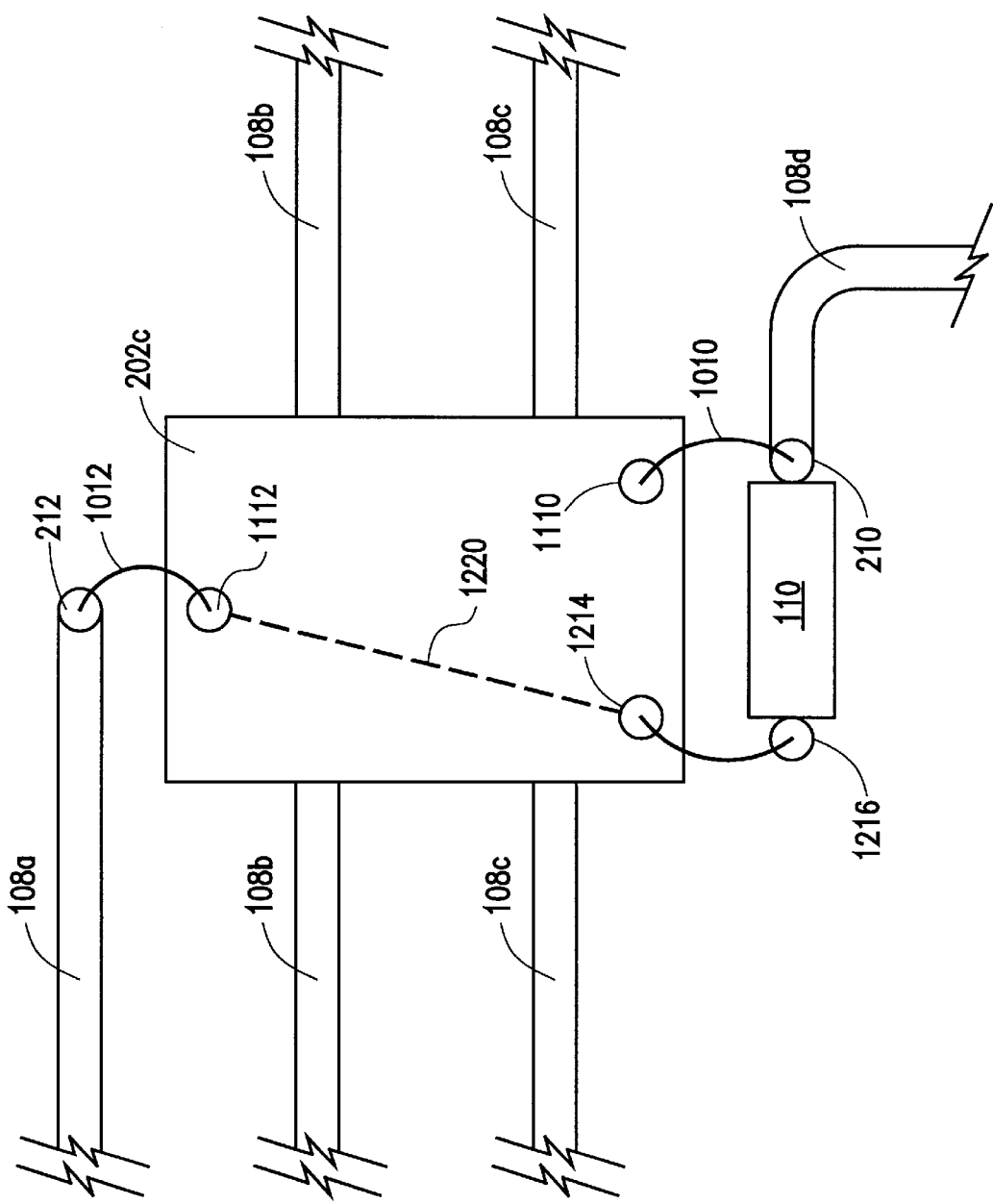
FIG. 12 is a schematic plan view of a portion of the RFID tag illustrated in FIG. 10.

Referring to FIGS. 10 and 11, a schematic plan view of the RFID tag of a bond wire embodiment and a schematic elevational view of a portion thereof is illustrated. A RFID tag device die 202c may be attached over a portion of the inductor coil 108 with an insulating layer 1120 of material therebetween. The insulating layer 1120 may be a B-staged kapton or epoxy that may be cured so as to attach the die 202c to the substrate 204. Mylar, mica, plastic, teflon, polyimide and the like may be used as an insulating layer that is attached to the substrate 204 and the die 202c. The die 202c has bond pads 1110 and 1112 thereon and wire bonding (bond wires) may be used to connect the die bond pads 1110 and 1112 to the inner end 210 and outer end 212 of the inductor coil 108. The bond wires 1010 and 1012 may be used as jumpers over the turns of the inductor coil 108 and further may allow the turns (108a, 108b, 108c and 108d) of the inductor coil 108 to remain at full width while passing under the die 202c. By allowing the turns of the inductor coil 108 to remain at full width, the coil turns 108a, 108b, 108c and 108d have a lower resistance and thus yield a higher quality factor (higher Q). Referring to FIG. 12, a conductive trace 1220 may also be provided within the die 202c that is a conductive circuit through the die 202c that may be adapted to connect an external capacitor 110 in parallel with the inductor coil 108. The external capacitor 110 may be located inside or outside of the inductor coil 108 and preferably is on the same side of the substrate 204 as the inductor coil 108 and die 202c.

The invention, therefore, is well adapted to carry out the objects and attain the ends and advantages mentioned, as well as others inherent therein. While the invention has been depicted, described, and is defined by reference to particular preferred embodiments of the invention, such references do not imply a limitation on the invention, and no such limitation is to be inferred. The invention is capable of considerable modification, alternation, and equivalents in form and function, as will occur to those ordinarily skilled in the pertinent arts. The depicted and described preferred embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. A radio frequency identification (RFID) tag, comprising:
    a substrate that is electrically insulated and transparent to radio frequency signals, said substrate having a surface;
    an inductor coil on the surface of said substrate, said inductor coil having an outer end and an inner end;
    a RFID tag device positioned over a portion of said inductor coil on the surface of said substrate, wherein said RFID tag device connects to the inner and outer ends of said inductor coil.

2. The RFID tag of claim 1, further comprising a conductive trace through said RFID tag device, wherein said conductive trace is adapted for connecting a capacitor to said inductor coil.

3. The RFID tag of claim 2, further comprising a comprising a capacitor located on the surface of said substrate and connected to said inductor coil.

4. The RFID tag of claim 3, wherein the capacitor is connected in parallel with said inductor coil.

5. The RFID tag of claim 3, wherein the capacitor is connected in series with said inductor coil.

6. The RFID tag of claim 1, wherein said inductor coil forms a resonant circuit antenna with an internal capacitor of said RFID tag device.

7. The RFID tag of claim 6, wherein said inductor coil and the internal capacitor form a parallel resonant circuit antenna.

8. The RFID tag of claim 1, wherein said RFID tag device is a flipchip having solder bump connections which are adapted to connect to the inner and outer ends of said inductor coil.

9. The RFID tag of claim 1, wherein said RFID tag device connects to the inner and outer ends of said inductor coil with bond wires.

10. The RFID tag of claim 1, wherein said inductor coil turns have a substantially constant width.

11. The RFID tag of claim 10, wherein said inductor coil turns have a low resistance and a high quality factor (Q).

12. The RFID tag of claim 1, further comprising an electrically insulating layer between said RFID tag device and the portion of said inductor coil.

13. The RFID tag of claim 12, wherein the electrically insulating layer is selected from the group consisting of mylar, mica, plastic, teflon, kapton and polyimide.

14. The RFID tag of claim 12, wherein the electrically insulating layer is attached to the portion of said inductor coil and said RFID tag device.

15. A method of fabricating an inexpensive radio frequency identification (RFID) tag, said method comprising the steps of:
    providing a substrate that is electrically insulated and transparent to radio frequency signals, wherein said substrate has a surface;
    forming an inductor coil on the surface of said substrate, said inductor coil having an outer end and an inner end;
    disposing a RFID tag device over a portion of said inductor coil on the surface of said substrate; and
    connecting said RFID tag device to the inner and outer ends of said inductor coil.

16. The method of claim 15, further comprising the step of providing a conductive trace through said RFID tag device, wherein said conductive trace is adapted for connecting a capacitor to said inductor coil.

17. The method of claim 16, further comprising the steps of locating a capacitor on the surface of said substrate and connecting said capacitor to said inductor coil.

18. The method of claim 17, wherein the capacitor is connected in parallel with said inductor coil.

19. The method of claim 17, wherein the capacitor is connected in series with said inductor coil.

20. The method of claim 15, further comprising the steps of providing an internal capacitor of said RFID tag device and connecting said internal capacitor to said inductor coil to form a resonant circuit antenna.

21. The method of claim 20, wherein said inductor coil and the internal capacitor form a parallel resonant circuit antenna.

22. The method of claim 15, wherein said RFID tag device is a flipchip having solder bump connections which are adapted for connecting to the inner and outer ends of said inductor coil.

23. The method of claim 15, further comprising the steps of connecting said RFID tag device to the inner and outer ends of said inductor coil with bond wires.

24. The method of claim 15, wherein said inductor coil turns have a substantially constant width.

25. The method of claim 24, wherein said inductor coil turns have a low resistance and a high quality factor (Q).

* * * * *